(12) United States Patent
Volk (10) Patent No.: US 6,356,105 B1
(45) Date of Patent: Mar. 12, 2002

(54) IMPEDANCE CONTROL SYSTEM FOR A CENTER TAPPED TERMINATION BUS

(75) Inventor: Andrew M. Volk, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/606,846

(22) Filed: Jun. 28, 2000

(51) Int. Cl.$^7$ .......................... H03K 17/16; H03K 3/01

(52) U.S. Cl. ...................... 326/30; 326/21; 326/86; 327/108

(58) Field of Search ................ 326/30, 21, 86, 326/90; 327/108

(56) References Cited

U.S. PATENT DOCUMENTS

| 4,992,677 | A | * | 2/1991 | Ishibashi et al. ............. 307/443 |
| 5,528,172 | A | * | 6/1996 | Sundstrom ..................... 326/80 |
| 6,115,773 | A | * | 9/2000 | Capps, Jr. et al. ........... 710/129 |
| 6,118,310 | A | * | 9/2000 | Esch, Jr. ...................... 327/108 |
| 6,188,237 | B1 | * | 2/2001 | Suzuli et al. .................. 326/30 |

* cited by examiner

Primary Examiner—Michael Tokar
Assistant Examiner—Vibol Tan
(74) Attorney, Agent, or Firm—Peter Lam (57) ABSTRACT

A method and apparatus for an impedance control system for a center tapped termination bus. One method of the present invention comprises comparing an output potential of a buffer with a pair of reference potentials. The output impedance of the buffer is adjusted to cause the buffer output voltage swing to match the reference potentials.

27 Claims, 7 Drawing Sheets

IMPEDANCE CONTROL SYSTEM FOR A CENTER TAPPED TERMINATION BUS

FIELD OF THE INVENTION

The present invention relates generally to the field of computers and computer systems. More particularly, the present invention relates to an impedance control system for a center tapped termination bus.

BACKGROUND OF THE INVENTION

Data buffers are used on a variety of integrated circuit devices to receive and drive data values between one device and another circuit coupled with to it. These data buffers are commonly connected to data buses that connect the output of a buffer to a receiving buffer of another device. Since a number of output buffers are often coupled to an individual bus, interface protocols have been developed to regulate signaling. Different aspects of a bus standard specify the impedance of a buffer when the buffer is driving a signal, the terminating impedance of a buffer when the buffer is not driving a signal, and signal voltage swing.

Double data rate (DDR) dynamic random access memory (DRAM) systems use a center-tapped termination (CTT) to control bus reflections. The buffers that drive the DDR bus are usually strong buffers with a series resistor to compensate the buffer to a target impedance that gives a target swing on the bus. An example of such system is shown in FIG. 1.

Figure 1:
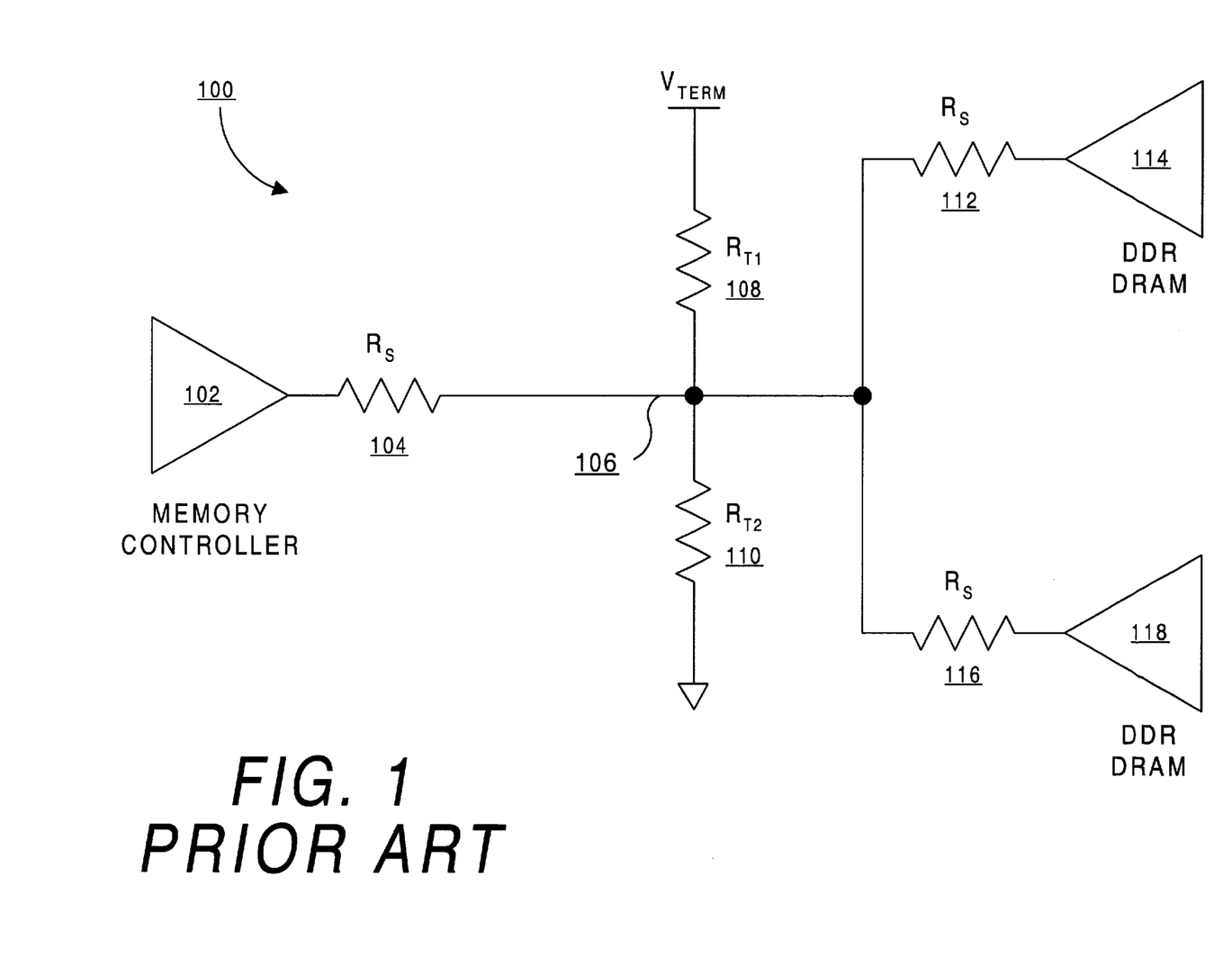
FIG. 1 illustrates an example of a prior art system having a DDR bus.

FIG. 1 illustrates an example of a prior art system 100 having a DDR bus 106. In this example, there are three agents (memory controller 102, DDR DRAM 114, DDR DRAM 118) coupled to the DDR bus 106. These agents 102, 114, 116 can be a driver or a receiver on the bus 106 at different times. The buffer of memory controller 102 is coupled to the bus 106 through a series resistance $R_s$ 104. This resistance can be internal to the buffer itself and is present to ensure good signal integrity on the bus 106. Similarly, the buffers of DDR DRAMs 114, 118 are also coupled to the bus 106 through $R_s$ 112 and 116, respectively. The bus 106 of this example includes a pair of impedances $R_{T1}$ 108 and $R_{T2}$ 110, which are termination resistances to help control signaling quality on the bus 106. Note that the termination resistances $R_{T1}$ 108 and $R_{T2}$ 110 can be replaced with a single resistor with a value equal to $R_{T1}$ 108 and $R_{T2}$ 110 in parallel and connected to a different termination voltage equal to $V_{TERM}(R_{T1}/(R_{T1}+R_{T2}))$, the Thevenin voltage.

The series resistors $R_s$ 104, 112, 116 plus the buffer impedance are set to give good signal integrity on the bus 106. The series resistor value may be different for the memory controller 102 and the DDR DRAM 114, 118. The CTT resistors set the reference level for the bus 106 around which the signal swing is set. The signal swing is determined by the ratio of buffer impedance plus $R_s$ to the Thevenin resistance of the CTT ($R_{T1}$ 108 in parallel to $R_{T2}$ 110).

Some drivers have been developed that integrate the resistor $R_s$ into the buffer driver. But some semiconductor processes do not have resistances with sufficiently good accuracy and temperature coefficient that can produce a buffer that will meet the DDR specifications. However, an impedance compensation capability is available that can be adapted to facilitate this need. A standard prior art synchronous, impedance compensated buffer is shown in FIG. 2.

Figure 2:
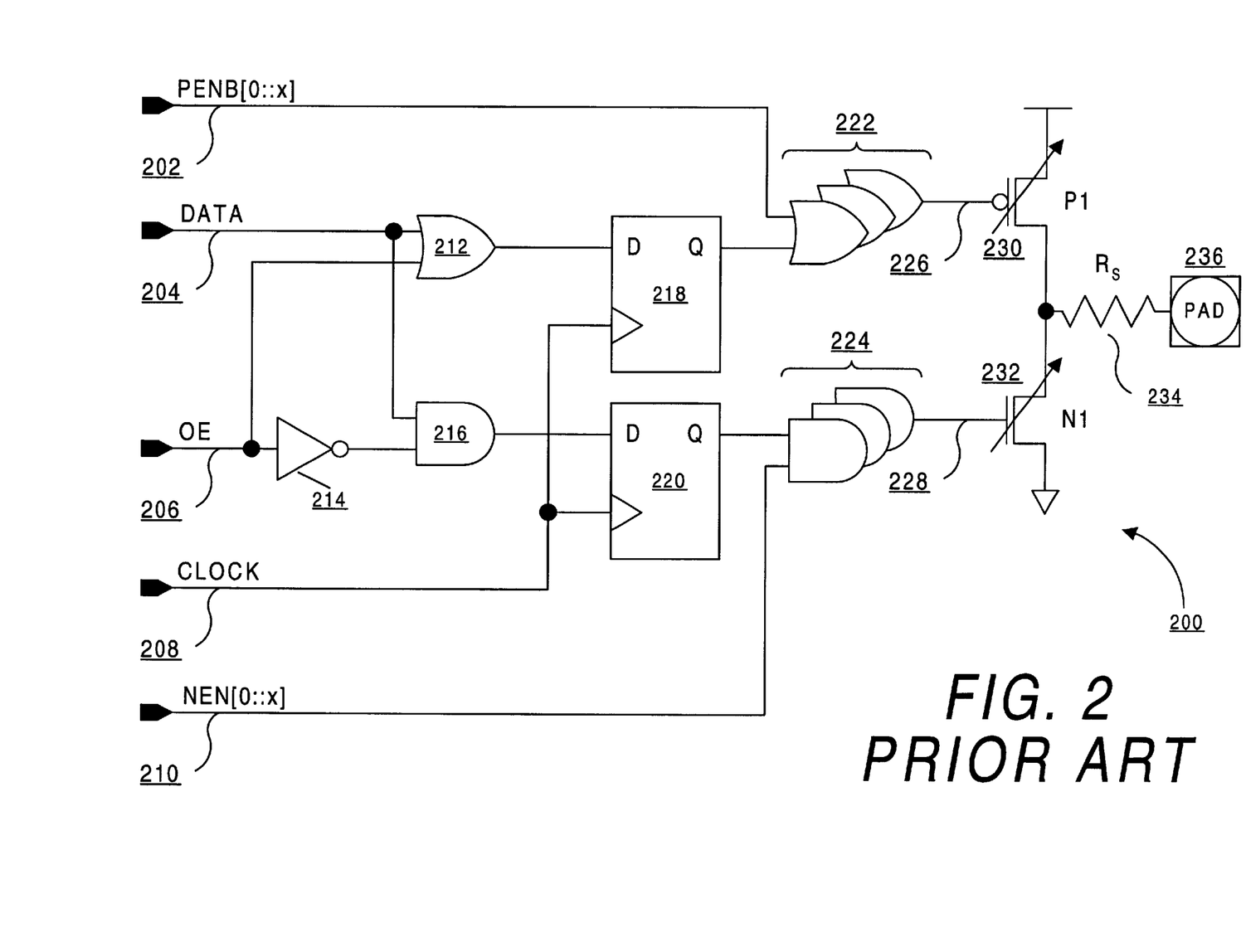
FIG. 2 is a prior art schematic diagram of a programmable strength buffer.

FIG. 2 is a prior art schematic diagram of a programmable strength buffer 200. The programmable strength buffer 200 of this example receives a number of input signals: PENB[0::x] 202, DATA 204, OE 206, CLOCK 208, and NEN[0::x] 210. PENB[0::x] 202 is a number of trim signals used to adjust the strength of adjustable P type transistor device P1 230. Similarly, NEN[0::x] 210 is a number of trim signals for adjusting the strength of adjustable N type transistor device N1 232.

The pull-up P1 230 and pull-down N1 232 transistors are made from multiple legs that can be enabled or disabled by the strength control bits PENB[0::x] 202 and NEN[0::x] 210, respectively. The OR gates 222 and AND gates 224 are only illustrative in purpose. The necessary logic varies depending on the particular implementation.

DATA input 204 is coupled to data latches 218, 220 through logic 212, 216 controlled with output enable signal OE 206. The outputs of data latches 218, 220 are coupled to logic 222, 224. Data latches 218, 220 latch and output DATA 204 to logic 222, 224 when OE 206 and CLOCK 208 are activated. The source terminal of P1 230 is connected to a VCC supply voltage and the gate terminals are connected to the outputs of logic 222. The source terminal of N1 232 is connected to a ground potential and the gate terminals are connected to the outputs of logic 224. The drain terminals of P1 230 and N1 232 are connected together with a first terminal of resistor $R_s$ 234. $R_s$ 234 also serves to linearize the voltage-current output characteristics of the buffer 200 as well as help set the proper buffer impedance. The second terminal of Rs 234 is connected to pad 236.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

A method and apparatus for an impedance control system for a center tapped termination bus is disclosed. The described impedance compensation mechanism may be used to control impedance for buffers in integrated circuits, but have other applications as well. The embodiments described herein are described in the context of a memory controller and a DDR bus interface, but are not so limited. Although the following embodiments are described with reference to memory controllers, other embodiments are applicable to other integrated circuits or logic devices. The same techniques and teachings of the present invention can easily be applied to other types of circuits or semiconductor devices that use a center tapped termination bus where the signal swings either side of a reference voltage (i.e. the Thevenin voltage of FIG. 1) or require impedance compensation.

In the following description, for purposes of explanation, numerous specific details are set forth in order to provide a thorough understanding of the present invention. One of ordinary skill in the art, however, will appreciate that these specific details are not necessary in order to practice the present invention. In other instances, well-known electrical structures and circuits have not been set forth in particular detail in order to not necessarily obscure the present invention.

Embodiments of the invention eliminate external resistors while not requiring a special process with precision resistors. Unlike prior impedance or resistance compensation (RCOMP) methods, methods of the present invention use the termination available on any pin to perform the compensation. The signal swing is directly set by the compensation method. The present disclosure also includes a provision for varying the signal swing to improve signal quality at the receiver and adaptable to possible changes in the DDR specification. Some testability capabilities such as $V_{REF}$ margining are also described.

Embodiments of the present invention can be used to control the buffer strength of the DRAM when in DDR mode. This mechanism allows the DDR interface to perform with better signal integrity at a lower system cost. One circuit is self-adjusting to accommodate a programmable signal swing level. A circuit designer developing a chipset supporting DDR may wish to use an embodiment of the present invention to compensate the chipset outputs, especially as the data rate of buses rise.

Figure 3:
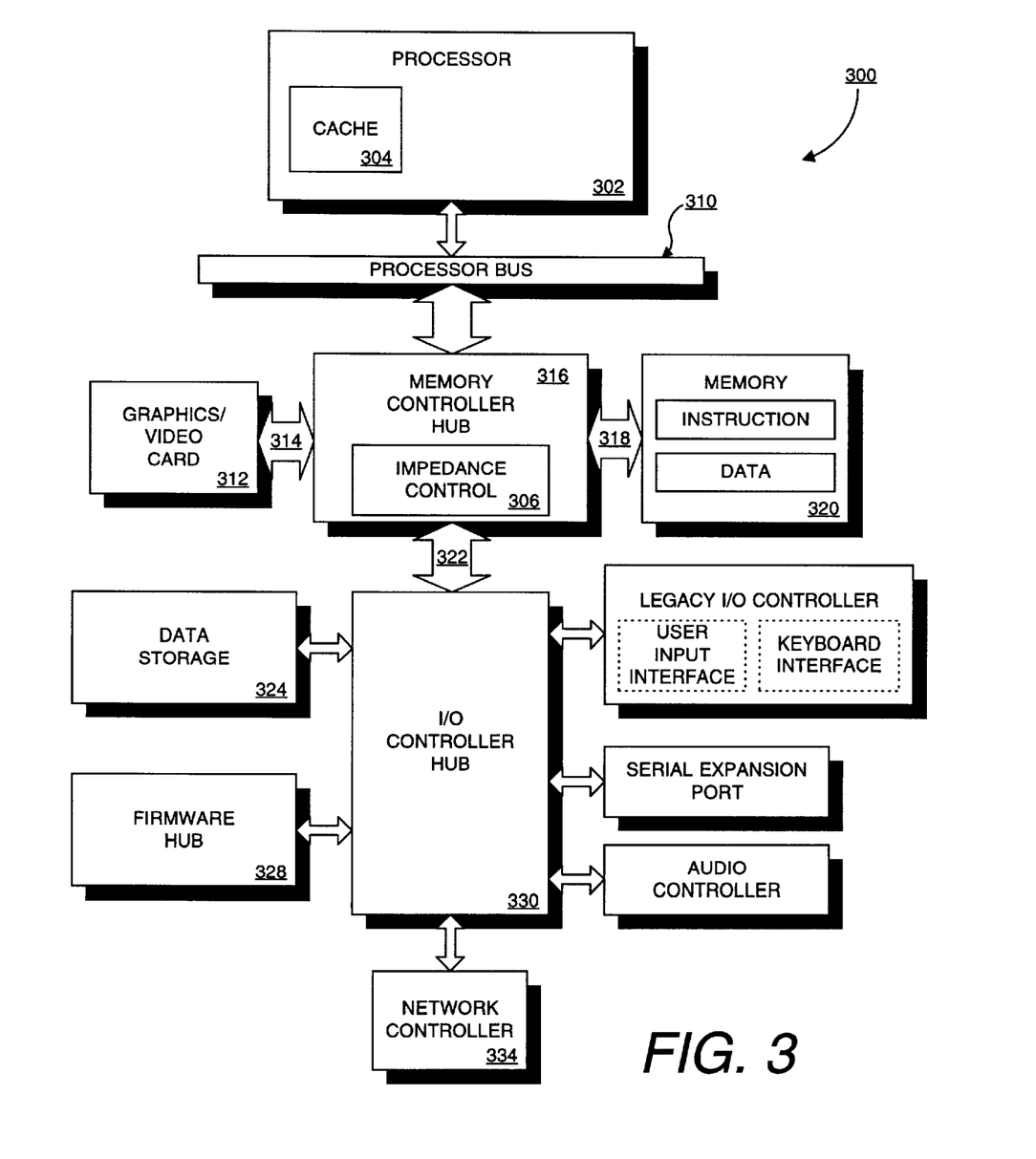
FIG. 3 is a block diagram of one embodiment of a system employing an impedance control system for a center tapped termination bus.

Referring now to FIG. 3, a computer system 300 is shown. System 300 includes a component, such as a memory controller hub 316, employing an impedance control mechanism in accordance with the present invention, such as in the embodiment described herein. System 300 is representative of processing systems based on the PENTIUM® Pro, PENTIUM® II, PENTIUM® III, Itanium® microprocessors available from Intel Corporation of Santa Clara, Calif., although other systems (including PCs having other microprocessors, engineering workstations, set-top boxes and the like) may also be used. In one embodiment, sample system 300 may be executing a version of the WINDOWS™ operating system available from Microsoft Corporation of Redmond, Wash., although other operating systems and graphical user interfaces, for example, may also be used. Thus, the present invention is not limited to any specific combination of hardware circuitry and software.

FIG. 3 is a block diagram of one embodiment of a system 300. System 300 is an example of a hub architecture. The computer system 300 includes a processor 302 that processes data signals. The processor 302 may be a complex instruction set computer (CISC) microprocessor, a reduced instruction set computing (RISC) microprocessor, a very long instruction word (VLIW) microprocessor, a processor implementing a combination of instruction sets, or other processor device, such as a digital signal processor, for example. FIG. 3 shows an example of an embodiment of the present invention implemented in a single processor system 300. However, it is understood that other embodiments may alternatively be implemented as systems having multiple processors. Processor 302 is coupled to a processor bus 310 that transmits data signals between processor 302 and other components in the system 300. The elements of system 300 perform their conventional functions well known in the art.

System 300 includes a memory 320. Memory 320 may be a dynamic random access memory (DRAM) device, a static random access memory (SRAM) device, flash memory device, or other memory device. Memory 320 may store instructions and/or data represented by data signals that may be executed by processor 302. A cache memory 304 can reside inside processor 302 that stores data signals stored in memory 320. Alternatively, in another embodiment, the cache memory may reside external to the processor.

An impedance control mechanism 306 for a center tapped termination bus also resides in memory controller hub 316. Alternate embodiments of an impedance control mechanism 306 can also be used in microcontrollers, embedded processors, graphics devices, DSPs, and other types of logic circuits.

A system logic chip 316 is coupled to the processor bus 310 and memory 320. The system logic chip 316 in the illustrated embodiment is a memory controller hub (MCH). The processor 302 communicates to the MCH 316 via a processor bus 310. The MCH 316 provides a high bandwidth memory path 318 to memory 320 for instruction and data storage and for storage of graphics commands, data and textures. The MCH 316 directs data signals between processor 302, memory 320, and other components in the system 300 and bridges the data signals between processor bus 310, memory 320, and system I/O 322. In some embodiments, the system logic chip 316 provides a graphics port for coupling to a graphics controller 312. The MCH 316 is coupled to memory 320 through a memory interface 318. The graphics card 312 is coupled to the MCH 316 through an Accelerated Graphics Port (AGP) interconnect 314.

System 300 uses a proprietary hub interface bus 322 to couple the MCH 316 to the I/O controller hub (ICH) 330. The ICH 330 provides direct connections to some I/O devices. Some examples are the audio controller, firmware hub (BIOS) 328, data storage 324, legacy I/O controller containing user input and keyboard interfaces, a serial expansion port such as Universal Serial Bus (USB), and a network controller 334. The data storage device 324 can comprise a hard disk drive, a floppy disk drive, a CD-ROM device, a flash memory device, or other mass storage device.

The present enhancement is not limited to computer systems. Alternative embodiments of the present invention can be used in other devices such as, for example, handheld devices and embedded applications. Some examples of handheld devices include cellular phones, Internet Protocol devices, digital cameras, personal digital assistants (PDAs), and handheld PCs. Embedded applications can include a microcontroller, a digital signal processor (DSP), system on a chip, network computers (NetPC), set-top boxes, network hubs, wide area network (WAN) switches, or any other system which uses a latch type mechanism for other embodiments.

Figure 4:
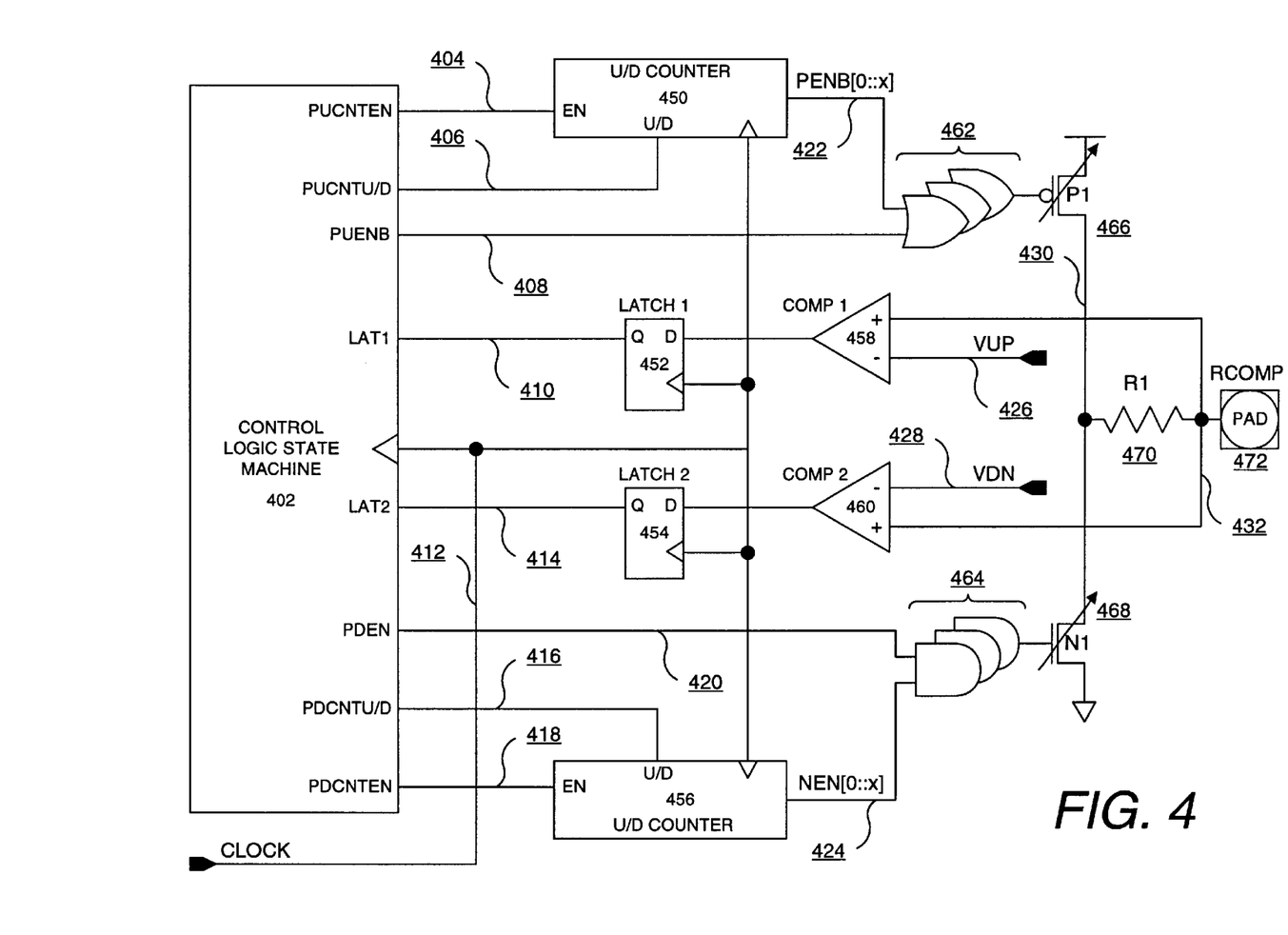
FIG. 4 is a schematic diagram of a first embodiment of an impedance compensation mechanism for a center tapped termination bus.

FIG. 4 is a schematic diagram of a first embodiment of an impedance compensation mechanism for a center tapped termination bus. A standard buffer pull-up and pull-down driver set is used to drive a copy of the CTT resistors. The pull-up and pull-down are enabled in turn. While the pull-up is enabled, the PENB counter 450 is enabled to count up or down depending on whether the voltage at the RCOMP pad 472 is higher or lower than the reference voltage VUP 426. VUP 426 is the desired upper output swing level for the buffer of FIG. 2. The input differential input buffer (comparator) COMP1 458 detects the RCOMP pad voltage and compares it to VUP 426 and allows the control logic state machine to determine whether to count up or down to find the optimum pull-up strength. This process is repeated for the pull-down transistor using the NEN bits 424, differential input buffer COMP2 460, and the VDN reference voltage 428. VDN 428 is the desired lower output swing level for the buffer of FIG. 2. When the strength bits are set for the correct swing levels, then the rest of the memory controller interface is updated with the strength bits.

This embodiment comprises of a control logic state machine 402, logic to adjust pull-up and pull-down transistors, an input pad, and comparators to compare the input voltage against references. The upper and lower halves of the mechanism in FIG. 4 are symmetric. CLOCK signal 412 is coupled to the control logic state machine 402, pull-up counter 450, pull-down counter 456, LATCH1 452, and LATCH2 454. CLOCK 412 allows the mechanism to operate synchronously and ensure proper operation.

The control logic state machine 402 provides a number of signals: PUCNTEN 404 to enable the pull-up up/down counter 450, PUCNTU/D 406 to direct the pull-up counter 450 to count up or down, PUENB 408 to enable the pull-up selection logic 462, PDCNTEN 418 to enable the pull-down up/down counter 456, PCNTU/D 416 to direct the pull-down counter 426 to count up or down, and PDEN 420 to enable the pull-down selection logic 464.

The pull-up counter 450 provides a series of selection signals PENB[0::x] 422 through logic devices 462 to select and enable various legs of the adjustable P type transistor device P1 466. P1 466 has a plurality of legs that can be selectively enabled to adjust the strength and operation of the device. The number of control bits used to control the buffer strength depends on the range and granularity needed to meet the DDR specification. The strengths of P1 466 and N1 468 are adjusted by enabling and disabling different legs of the transistor devices. PENB[0::x] 422 and NEN[0::x] 424 are coupled to a plurality of logic gates 462 and 464, respectively, that control the adjustments of P1 466 and N1 468. For example, as more legs of P1 466 are enabled, current can be conducted more strongly and the resistance of reduced. The source terminal of P1 466 is connected to a VCC supply voltage and the drain terminal of P1 466 is connected to a first terminal of resistor $R_s$ 470 and the drain terminal of N1 468. Resistor $R_s$ 470 linearizes the output of the buffer formed by P1 466, N1 468 and pad 472. The second terminal of $R_s$ 470 is connected to the RCOMP pad 472. The resistor $R_s$ 470 is shown in the output path as a way to make the driver have a more linear output impedance which will give better signal integrity. The larger the value of $R_s$ 470, the more linear the buffer output. However, a larger $R_s$ 470 also requires a stronger (larger) buffer to get to the target impedance. One benefit of a larger buffer is a better granularity.

The pull-down portion of the circuit operates in a similar fashion. The pull-down counter 456 provides a series of selection signals NEN[0::x] 424 through logic devices 464 to select and enable various legs of the adjustable N type transistor device N1 468. N1 468 has a plurality of legs that can be selectively enabled to adjust the strength and operation of the device. The source terminal of N1 468 is connected to a ground potential and the drain terminal of N1 468 is connected to a first terminal of resistor $R_s$ 470 and the drain terminal of P1 466.

The logic devices for adjusting the legs of P1 466 and N1 468 are shown with OR gates 462 and AND gates 464 in FIG. 4 for illustrative purposes. The logic of can vary depending on the particular implementation.

When this impedance compensation circuit is in operation, the RCOMP pad 472 is supplied with a voltage from a center tapped termination bus. The upper and lower halves of this mechanism are operated separately. When the pull-up P1 466 is adjusted, the pull-down portion of the circuit is disabled. Similarly, when the pull-down N1 468 is adjusted, the pull-up portion of the circuit is disabled. Hence, PUCNTEN 404 and PDCNTEN 418 are mutually exclusive for activation.

For this embodiment, the buffer upper swing impedance is adjusted first with the pull-up portion of the mechanism. Then the buffer lower swing impedance is adjusted with the pull-down portion of the circuit. For alternative embodiments, the lower swing can be adjusted first and then the upper swing. Similarly, the upper and lower swings do not have to be fully adjusted before the other swing is adjusted. For instance, the impedance compensation adjustments can alternate between the upper swing and then the lower swing, causing both swing levels to be almost simultaneously adjusted.

Comparator COMP1 458 has the potential of RCOMP 472 coupled to a first input and a reference voltage VUP 426. VUP 426 is a reference voltage that indicates the desired upper swing of the buffer. COMP1 458 compares RCOMP 472 with VUP 426 and outputs the result to latch LATCH1 452. The latch mechanism helps to stabilize the result for the control logic state machine 402 as the trim process is happening. This stabilization can be helpful especially as RCOMP 472 approaches the appropriate reference voltage. LATCH 1 452 latches the result and drives that to the control logic state machine 402. Control logic state machine 402 enables the pull-up up/down counter 450 accordingly and P1 adjustment logic 462. Based on the comparator result, the control logic state machine 402 either toggles the counter 450 to count up or down to activate or deactivate corresponding legs of P1 466. This portion of the circuit operates as an analog to digital converter. The adjustments to P1 466 alter the buffer impedance, and thus the voltage potential at RCOMP 472. COMP1 458 again samples RCOMP 472 and compares the newly adjusted voltage to VUP 426. The control logic state machine 402 evaluates the comparison result determines whether RCOMP 472 is at the desired level or if the pull-up 466 needs to be adjusted again. Depending on the particular implementation, this operation repeats until RCOMP 472 has reached a tolerable level or is equal to VUP 426.

The pull-down portion of the impedance compensation mechanism is configured in a similar manner and operates in a similar fashion. Comparator COMP2 460 has the potential of RCOMP 472 coupled to a first input and a reference voltage VDN 428. VDN 428 is a reference voltage that indicates the desired lower swing of the buffer. COMP2 460 compares RCOMP 472 with VDN 428 and outputs the result to latch LATCH2 454. LATCH 2 454 latches the result and drives that to the control logic state machine 402. Control logic state machine 402 enables the pull-down up/down counter 456 accordingly and N1 adjustment logic 464. Based on the comparator result, the control logic state machine 402 either toggles the counter 456 to count up or down to activate or deactivate corresponding legs of N1 468. The adjustments to N1 468 alter the buffer impedance, and thus the voltage potential at RCOMP 472. COMP2 460 again samples RCOMP 472 and compares the newly adjusted voltage to VDN 428. The control logic state machine 402 evaluates the comparison result determines whether RCOMP 472 is at the desired level or if the pull-down 468 needs to be adjusted again. Depending on the particular implementation, this operation repeats until RCOMP 472 has reached a tolerable level or is equal to VDN 428.

There are several variations on this scheme. The one described above assumes a separate compensation buffer that updates the interface at regular intervals. The same thing can be done with any of the buffers of a standard interface. Only the two extra differential input buffers have to be attached to the pin used for RCOMP. The inputs of the input buffers should also be filtered to remove noise, but is not shown in these figures. The interface can be quieted for a brief time and the buffer would first be set high and the pull-up strength bits set, then set low and the pull-down bits set. This operation is first done at reset time, as in previous interfaces, and then again during DRAM refresh or other slack times. If the previous values are used to start the search, the time to perform subsequent searches can be minimized. Pull-up and pull-down devices can also be adjusted in alternate slack times to minimize any given search time. Adjustments can be made more frequently, but limited to a single bit of adjustment per update. This method more than covers the worst case impedance drift. If the updates are done during quiet times, then there is no need to store and forward buffering between the RCOMP buffer and the rest of the bus interface.

Care should be taken not to produce glitches on clocks and strobes. If the DDR specification has a large enough range of acceptable impedances, the compensation cycle at rest may be sufficient. Extra granularity can be added to the buffers to allow for drift. Since computer system tends to heat up after reset, the direction of drift is known and the initial value can be set (biased) to account for such drift.

Figure 5:
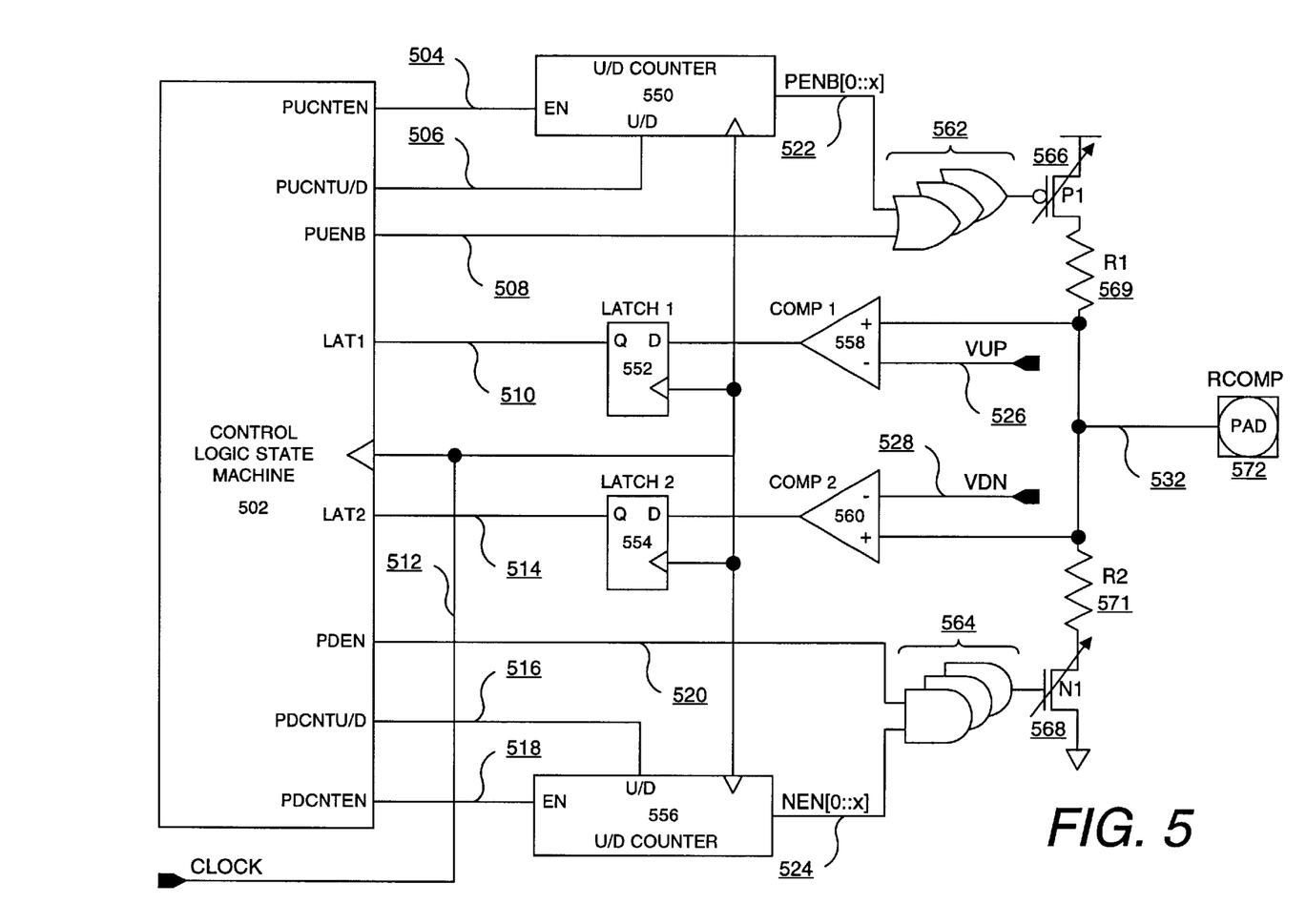
FIG. 5 is a schematic diagram of an alternative embodiment of an impedance compensation mechanism.

FIG. 5 is a schematic diagram of an alternative embodiment of an impedance compensation mechanism to linearize a buffer. The circuit of FIG. 5 is similar to the embodiment of FIG. 4. The internal impedance of the buffer of FIG. 4 is due to RS 470, P1 566, and N1 568. For this present embodiment, the impedance is separated out for the pull-up and pull-down portions of the mechanism. One such situation may be where the upper and lower portions of the mechanisms are located at different areas of the chip. In another implementation, the impedance of P type and N type devices can be different and the additional resistance of different values is needed to compensate.

The area of interest is the buffer portion on the right hand side of FIG. 5. The source terminal of pull-up P1 566 is coupled to a VCC supply potential and the drain terminal of P1 566 is coupled to a first terminal of R1 569. The second terminal of R1 569 is coupled to a first input of comparator COMP1 558 and also to the RCOMP pad 572. The source terminal of pull-down N1 568 is coupled to a ground potential and the drain terminal of N1 568 is coupled to a first terminal of R2 571. The second terminal of R2 571 is coupled to a first terminal of comparator COMP2 560 and also to RCOMP 572.

The operation of the mechanism in FIG. 5 is similar to that of FIG. 4. The control logic state machine 502 samples the potential at RCOMP 532 and adjusts the buffer upper (lower) swing with pull-up P1 566 (pull-down N1 568) in order to match RCOMP 532 to VUP 526 (VDN 528).

Figure 6:
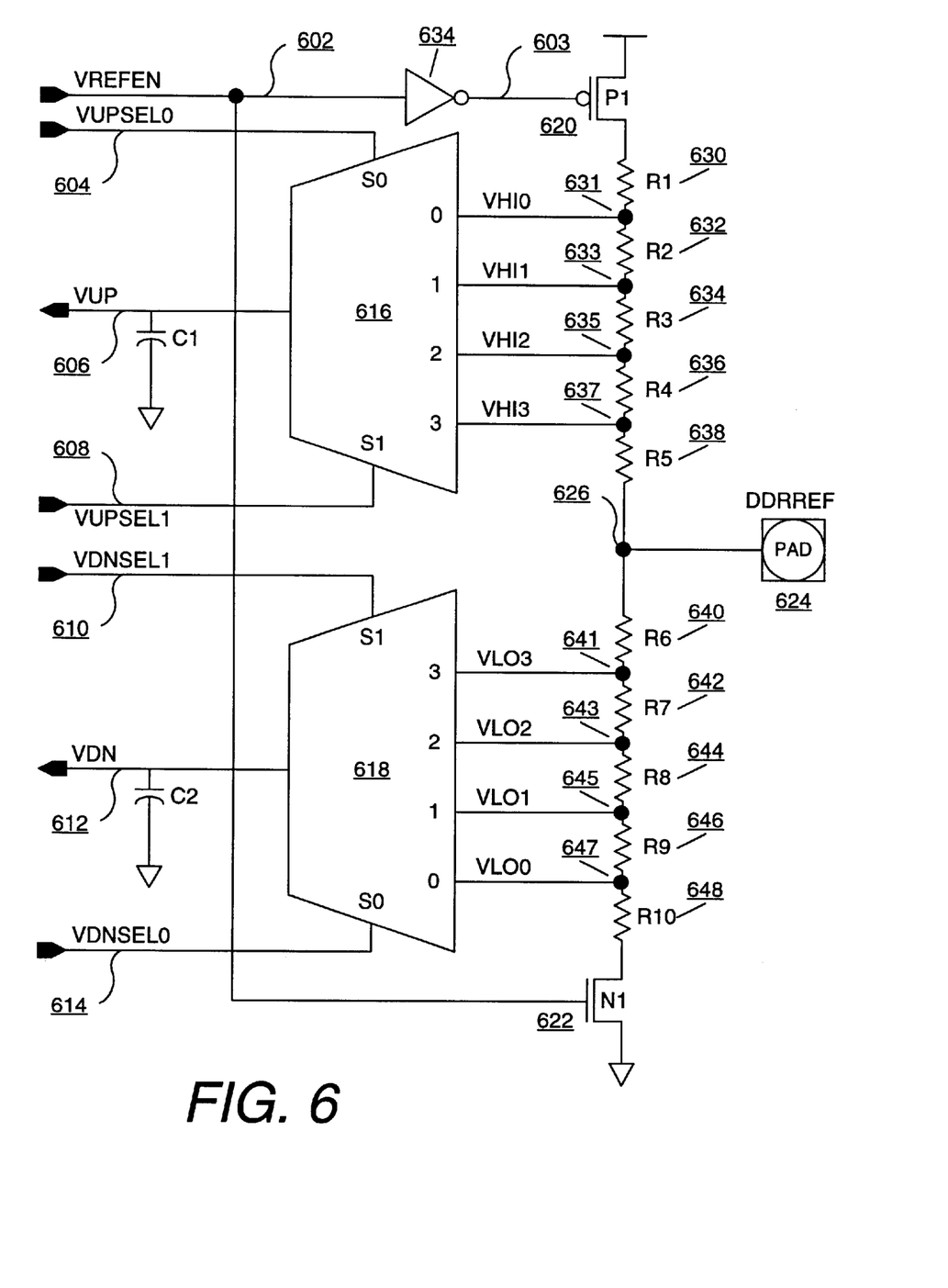
FIG. 6 is a schematic diagram of one embodiment of a voltage swing reference generator.

FIG. 6 is a schematic diagram of one embodiment of a voltage swing reference generator. This circuit operates as a digital to analog converter. Since the DDR specification is not finalized, circuit designers may find it desirable to allow the swing setting to be programmable. The voltage swing reference generator also provides a means to tune the voltage swing such that it is optimized at the receiver based on system design knowledge. The resistor taps provide choices of voltage swing above and below the CTT reference point. The embodiment of FIG. 6 shows four taps each for an upper reference and a lower reference, although more could be provided. The "center" of the reference resistor string is shown coupled to the reference switching voltage for the interface. The resistors in the divider need to have values much larger than of the divider used to set the voltage externally so as not to disturb that external reference voltage. By having this connection, the internal swing values can be referenced to the external value and better adapted to the system settings. The connection to the reference voltage could also be omitted and the reference swing voltages can be simply a division of the local power supply. Once the specification is frozen, the default divider value can be set. The selection mechanism can also be used as a design for test (DFT) mechanism to margin the voltage swing and test the output buffer characteristics. This or a similar voltage divider stack can also be used to provide the DDRREF voltage to the interface input buffers through a similar kind of mux. This reference generator circuit also allows the input voltage margin to be automatically tested.

The reference generator circuit includes a resistor chain to generate an upper swing reference voltage and a lower swing reference voltage. A P type transistor P1 620 heads up a first end of the resistor chain. The source terminal of P1 620 is coupled to a VCC supply potential and the gate terminal 603 is coupled to a reference circuit enable signal VREFEN 602 through an inverter 634. The drain terminal of P1 620 is coupled to a first terminal of R1 630. The first portion of the resistor chain is formed with R1 630, R2 632, R3 634, R4 636, and R5 638. The second terminal of R5 638 is coupled to a pad 624. For this embodiment, the potential coupled to the pad 624 is a DDRREF signal. DDRREF is a reference voltage for a center tapped termination bus. Alternative embodiments can have another type of reference signal.

The midpoint of the resistor chain should be centered about the reference voltage as on the pad 624. For a receiver on the center tapped termination bus, an external reference voltage is coupled to pad 624.

Also coupled to DDRREF pad 624 is the second portion of the resistor chain. The second portion of the resistor chain is formed with R6 640, R7 642, R8 644, R9 646, and R10 648. The second terminal of R10 648 is coupled to the drain terminal of N type transistor N1 622. The gate terminal of N1 622 is coupled to VREFEN 602 and the source terminal of N1 622 is coupled to a ground potential.

The first portion of the resistor chain provides a plurality of voltage potentials at taps VHI0 631, VHI2 633, VHI2 635, VHI3 637 ranging from below the VCC supply voltage to above DDRREF 624. However, selecting DDRREF 624 is the same as selecting zero swing up from DDRREF, which is not desirable. Similarly, selecting VCC is impractical since even if P1 devices 466, 566, were able to zero ohms, RCOMP 472, 572, will never reach VCC for any non-zero value of R1 470 or 569. Taps VHI0 631, VHI1 633, VHI2 635, VHI3 637 are coupled to the inputs of a multiplexer (mux) 616. Selection signals VUPSEL0 604 and VUPSEL1 608 are used to control the selection of which input value is driven to the mux output VUP 606. VUP 606 is the upper swing reference voltage used to adjust the buffer upper swing impedance as in the mechanism of FIGS. 4 and 5.

The second portion of the resistor chain provides a plurality of voltage potentials at taps VLO3 641, VLO2 643, VLO1 645, VLO0 647 ranging from below DDRREF 624 to above the ground potential. However, selecting DDRREF 624 is the same as selecting zero swing down from DDRREF, which is not desirable. Taps VLO3 641, VLO2 643, VLO1 645, VLO0 647 are coupled to the inputs of a mux 618. Selection signals VDNSEL0 614 and VDNSEL1 610 are used to control the selection of which input value is driven to the mux output VDN 612. VDN 612 is the lower swing reference voltage used to adjust the buffer lower swing impedance as in FIGS. 4 and 5.

Figure 7:
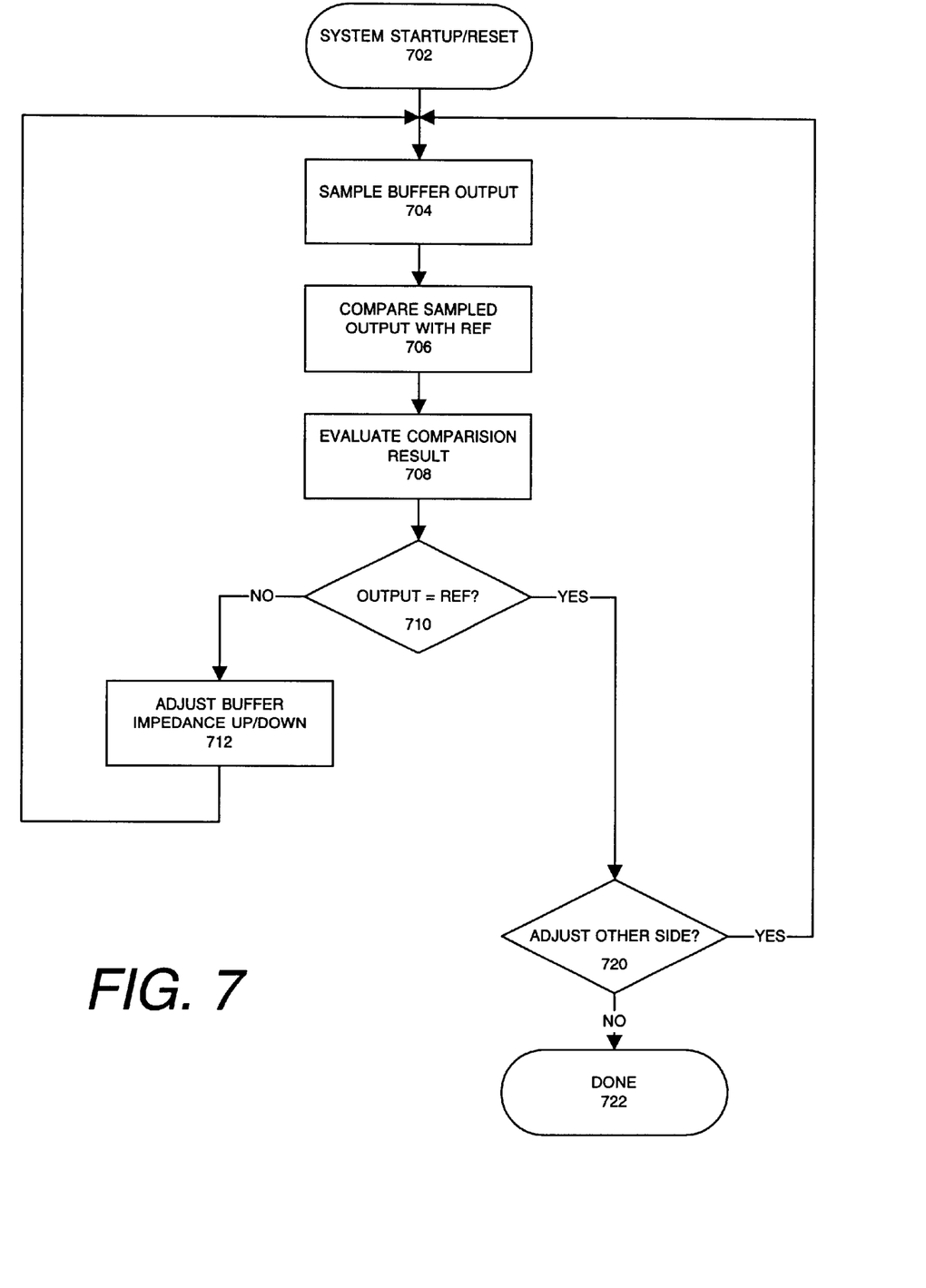
FIG. 7 is a flow diagram illustrating how buffer impedance is compensated for one embodiment of the present invention.

FIG. 7 is a flow diagram illustrating how buffer impedance is compensated for one embodiment of the present invention. At step 702, the integrated circuit device powers up or resets. The buffer output is sampled at step 704. The sampled output is compared with the appropriate reference voltage at step 706. For example, when the pull-up is being adjusted, the reference used is that for the upper swing. The comparison result is evaluated during step 708.

If the buffer output is not sufficiently equal to the reference voltage at step 710, then the buffer impedance is adjusted up or down accordingly at step 712. If the buffer output is equal to the reference, then this upper (lower) portion of the buffer output swing is correct. After the pull-up (pull-down) is adjusted, the newly modified buffer output is sampled again at 704. The new buffer output voltage is compared to the reference voltage at step 706 and reevaluated at step 708. If the output voltage is not sufficiently equal to the reference at step 710, then the buffer impedance is again adjusted at step 712.

If the output voltage is sufficiently equal to the reference, then this upper (lower) portion of the buffer output swing is correct. At step 720, the circuit determines whether the opposite swing of the buffer is to be adjusted at this time. If the other swing is to be adjusted, the procedure repeats for the other swing at step 704. If the other swing is not to be adjusted at this time, the procedure is done at step 722.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A method comprising:
   comparing an output potential of a buffer with a pair of reference potentials;
   generating a result from said comparison;
   storing said result for later evaluation; and
   adjusting output impedance of said buffer to cause said output voltage swing to match said reference potentials.

2. The method of claim 1 further comprising sampling said output buffer voltage at a pad, said pad coupled to a center tapped termination bus.

3. The method of claim 1 further comprising evaluating said result to determine whether output impedance should be adjusted.

4. The method of claim 1 wherein said output potential is repeatedly sampled and said impedance adjusted to maintain proper buffer output swing.

5. The method of claim 1 wherein said output impedance adjustment affects upper swing of said output voltage of said buffer.

6. The method of claim 1 wherein said output impedance adjustment affects lower swing of said output voltage of said buffer.

7. An apparatus comprising:
   a first comparator to compare an output of a buffer and a first reference voltage;
   control state machine logic coupled to said first comparator, said state machine logic to evaluate an output of said first comparator;
   adjustment logic coupled to said state machine logic, said adjustment logic to alter output impedance of said buffer; and
   an adjustable impedance device coupled to said adjustment logic, said impedance device varying according to inputs from said adjustment logic.

8. The apparatus of claim 7 further comprising a second comparator to compare said output of said buffer and a second reference voltage, said second comparator coupled to said control state machine logic and to provide an output to said control state machine logic.

9. The apparatus of claim 7 wherein said buffer is coupled to a center tapped termination bus.

10. The apparatus of claim 7 wherein said adjustable impedance device is a P type transistor device having a plurality of selectable legs.

11. The apparatus of claim 7 wherein said adjustable impedance device alters upper swing of said buffer.

12. The apparatus of claim 7 wherein said adjustable impedance device is an N type transistor device having a plurality of selectable legs.

13. The apparatus of claim 7 wherein said adjustable impedance device alters lower swing of said buffer.

14. An integrated circuit device comprising:
   a data pad;
   an output buffer coupled to said data pad, said output buffer to provide an output voltage to said pad; and
   an impedance control mechanism coupled to said output buffer, said mechanism comprising:
      a first comparator to compare a pad voltage and a first reference voltage;
      control state machine logic coupled to said first comparator, said state machine logic to evaluate an output of said first comparator;
      adjustment logic coupled to said state machine logic, said adjustment logic to alter output impedance of said buffer; and
      an adjustable impedance device coupled to said adjustment logic, said impedance device varying according to inputs from said adjustment logic.

15. The integrated circuit device of claim 14 wherein said data pad is coupled to a center tapped termination bus.

16. The integrated circuit device of claim 14 wherein said adjustable impedance device is a P type transistor device having a plurality of selectable legs.

17. The integrated circuit device of claim 14 wherein said adjustable impedance device alters upper swing of said buffer.

18. The integrated circuit device of claim 14 wherein said adjustable impedance device is an N type transistor device having a plurality of selectable legs.

19. The integrated circuit device of claim 14 wherein said adjustable impedance device alters lower swing of said buffer.

20. The integrated circuit device of claim 14 further comprising a second comparator to compare said output of said buffer and a second reference voltage, said second comparator coupled to said control state machine logic and to provide an output to said control state machine logic.

21. The integrated circuit device of claim 14 further comprising a reference generator to generate a pair of reference voltages.

22. A system comprising:

a bus;

a first integrated circuit device coupled to said bus, said first integrated circuit comprising:
- an output buffer coupled to a data pad, said output buffer providing an output voltage to said pad; and
- an impedance control mechanism coupled to said output buffer, said mechanism comprising:
  - a first comparator to compare a pad voltage and a first reference voltage;
  - control state machine logic coupled to said first comparator, said state machine logic to evaluate an output of said first comparator;
  - adjustment logic coupled to said state machine logic, said adjustment logic to alter output impedance of said buffer; and
  - an adjustable impedance device coupled to said adjustment logic, said impedance device varying according to inputs from said adjustment logic; and a second integrated circuit device coupled to said bus, said second integrated to receive a data signal from said first integrated circuit device.

23. The system of claim 22 wherein said bus is a center tapped termination bus.

24. The system of claim 22 wherein said adjustable impedance device is a P type transistor device having a plurality of selectable legs.

25. The system of claim 22 wherein said adjustable impedance device is an N type transistor device having a plurality of selectable legs.

26. The system of claim 22 further comprising a reference generator to generate a pair of reference voltages.

27. The system of claim 22 further comprising a second comparator to compare said output of said buffer and a second reference voltage, said second comparator coupled to said control state machine logic and to provide an output to said control state machine logic.

* * * * *

UNITED STATES PATENT AND TRADEMARK OFFICE
CERTIFICATE OF CORRECTION

PATENT NO. : 6,356,105 B1  Page 1 of 1
DATED : March 12, 2002
INVENTOR(S) : Volk It is certified that error appears in the above-identified patent and that said Letters Patent is hereby corrected as shown below:

Column 8,
Line 49, delete "VHI2", insert -- VHI1 --.

Signed and Sealed this

Eighteenth Day of June, 2002

Attest:

Attesting Officer

JAMES E. ROGAN
Director of the United States Patent and Trademark Office